US007851787B2

(12) United States Patent
Han

(10) Patent No.: US 7,851,787 B2
(45) Date of Patent: Dec. 14, 2010

(54) ORGANIC THIN FILM TRANSISTOR WITH TUNNELING BARRIER LAYER AND METHOD OF MANUFACTURING THE SAME

(75) Inventor: Chang Wook Han, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 236 days.

(21) Appl. No.: 11/645,733

(22) Filed: Dec. 27, 2006

(65) Prior Publication Data

US 2007/0152211 A1    Jul. 5, 2007

(30) Foreign Application Priority Data

Dec. 29, 2005    (KR) ...................... 10-2005-0134409

(51) Int. Cl.
*H01L 35/24* (2006.01)
*H01L 51/00* (2006.01)
(52) U.S. Cl. ................................. 257/40; 257/E51.006
(58) Field of Classification Search .................. 438/99; 257/E51.006, 40, 99
See application file for complete search history.

(56) References Cited

U.S. PATENT DOCUMENTS

| | | | | |
|---|---|---|---|---|
| 5,312,643 A | * | 5/1994 | Yamamoto et al. .......... 427/108 |
| 7,208,756 B2 | * | 4/2007 | Shih et al. ..................... 257/40 |
| 7,485,894 B2 | * | 2/2009 | Ahn et al. ..................... 257/40 |
| 2004/0002176 A1 | * | 1/2004 | Xu ................................ 438/40 |
| 2004/0012017 A1 | * | 1/2004 | Nagayama .................... 257/40 |
| 2004/0161873 A1 | | 8/2004 | Dimitrakopoulos et al. |
| 2005/0052127 A1 | * | 3/2005 | Sakata et al. ................. 313/506 |
| 2005/0263756 A1 | * | 12/2005 | Yatsunami et al. ............. 257/40 |

FOREIGN PATENT DOCUMENTS

CN    1476111 A    2/2004
CN    1495931 A    5/2004

* cited by examiner

*Primary Examiner*—David S Blum
(74) *Attorney, Agent, or Firm*—Morgan, Lewis & Bockius LLP

(57) ABSTRACT

The present application relates to an organic thin film transistor with tunneling barrier layer and method of manufacturing the same improving the mobility properties of the thin film transistor and preventing the current crowding at low voltages. The organic thin film transistor includes a buffer layer on a substrate, a source and drain electrodes on the buffer layer, wherein each of the source and drain electrodes is in an island shape, a tunneling barrier layer on the source and drain electrodes, an organic semiconductor layer on the tunneling barrier layer, a gate insulation layer on the organic semiconductor layer, and a gate electrode overlapping both edges of the source and drain electrodes, and formed on the gate insulation layer, and wherein the tunneling barrier layer under the organic semiconductor layer is formed between the source and drain electrodes and the gate electrode.

13 Claims, 4 Drawing Sheets

ORGANIC THIN FILM TRANSISTOR WITH TUNNELING BARRIER LAYER AND METHOD OF MANUFACTURING THE SAME

This application claims the benefit of the Korean Patent Application No. P2005-134409, filed on Dec. 29, 2005, which is hereby incorporated by reference in its entirety.

BACKGROUND OF THE INVENTION

1. Field of the Invention

The embodiments of the invention relate to a transistor and a method for manufacturing the same, and more particularly, to an organic thin film transistor and a method for manufacturing the same.

2. Discussion of the Related Art

Generally, a thin film transistor is used as a switching element for a display device. The thin film transistor may be formed of various materials, such as silicon and organic materials. The organic thin film transistor is formed of an organic semiconductor material. The organic thin film transistor is formed on a flexible substrate instead of a glass substrate. Other than the organic thin film transistor using the organic semiconductor material and the flexible substrate, the organic thin film transistor is similar in structure to the silicon thin film transistor.

FIG. 1 is a cross-sectional view of illustrating the related art organic thin film transistor. As shown in FIG. 1, the related art organic thin film transistor includes a gate electrode 52a of a metal material formed on a lower substrate 51, a gate insulation layer 53 formed on the lower substrate 51, including the gate electrode 52a, source and drain electrodes 55a and 55b overlapping both edges of the gate electrode 52a and formed on the gate insulation layer 53, and an organic semiconductor layer 54 formed on the gate insulation layer 53 including the source and drain electrodes 55a and 55b. In this case, the source and drain electrodes 55a and 55b can be formed of a metal material, such as palladium (Pd) or argentums (Ag). However, if the source and drain electrodes of the organic thin film transistor are formed of a metal material, such as plumbum (Pb) or argentums (Ag), a metal patterning process for the source and drain electrodes is complicated and complex, and adhesive strength between the metal material and the organic semiconductor becomes weak.

The source and drain electrodes can be formed of a transparent conductive layer, such as indium tin oxide (ITO) and indium zinc oxide (IZO). The transparent conductive layer has the advantage of being easy to pattern. However, source and drain electrodes are formed of transparent conductive layers having a high contact resistance with the organic semiconductor layer. More specifically, if the source/drain electrodes are formed of transparent conductive layers, an energy barrier occurs at the interface between the transparent conductive layer and the organic semiconductor layer. Such an energy barrier prevents a charge injection so as to increase resistance between the transparent source/drain electrodes and the organic semiconductor layer. More specifically, the energy barrier interrupts the movement of majority carriers in an accumulation mode. Due to such a resistance increase between the organic semiconductor layer 54 and the source/drain electrodes 55a/55b, the mobility is lowered and current crowding occurs at low voltages, which degrades the operating characteristics of the thin film transistor.

SUMMARY OF THE INVENTION

Accordingly, embodiments of the invention are directed to an organic thin film transistor and a method for manufacturing the same, which substantially obviates one or more problems due to limitations and disadvantages of the related art.

An object of embodiments of the invention is to provide an organic thin film transistor and a method for manufacturing the same, which can decrease contact resistance between an organic semiconductor layer and transparent source/drain electrodes.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic thin film transistor includes a buffer layer on a substrate, a source and drain electrodes on the buffer layer, wherein each of the source and drain electrodes is in an island shape, a tunneling barrier layer on the source and drain electrodes, an organic semiconductor layer on the tunneling barrier layer, a gate insulation layer on the organic semiconductor layer, and a gate electrode overlapping both edges of the source and drain electrodes, and formed on the gate insulation layer.

In another aspect of the invention, a method for manufacturing an organic thin film transistor includes forming a buffer layer and a transparent conductive layer over a substrate, forming source and drain electrodes by patterning the transparent conductive layer, forming a tunneling barrier layer on the source and drain electrodes, and the buffer layer, sequentially forming an organic semiconductor layer and a gate insulation layer on the tunneling barrier layer, and forming a gate electrode on the gate insulation layer.

In yet another aspect, an organic thin film transistor includes a source and drain electrodes over a substrate, each of the source and drain electrodes having in an island shape, a tunneling barrier layer on the source and drain electrodes, and extending between the source and drain electrodes, an organic semiconductor layer on the tunneling barrier layer, a gate insulation layer on the organic semiconductor layer, and a gate electrode overlapping both edges of the source and drain electrodes, and on the gate insulation layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the invention, examples of which are illustrated in the accompanying drawings. Wherever possible, the same reference numbers will be used throughout the drawings to refer to the same or like parts.

Figure 1:
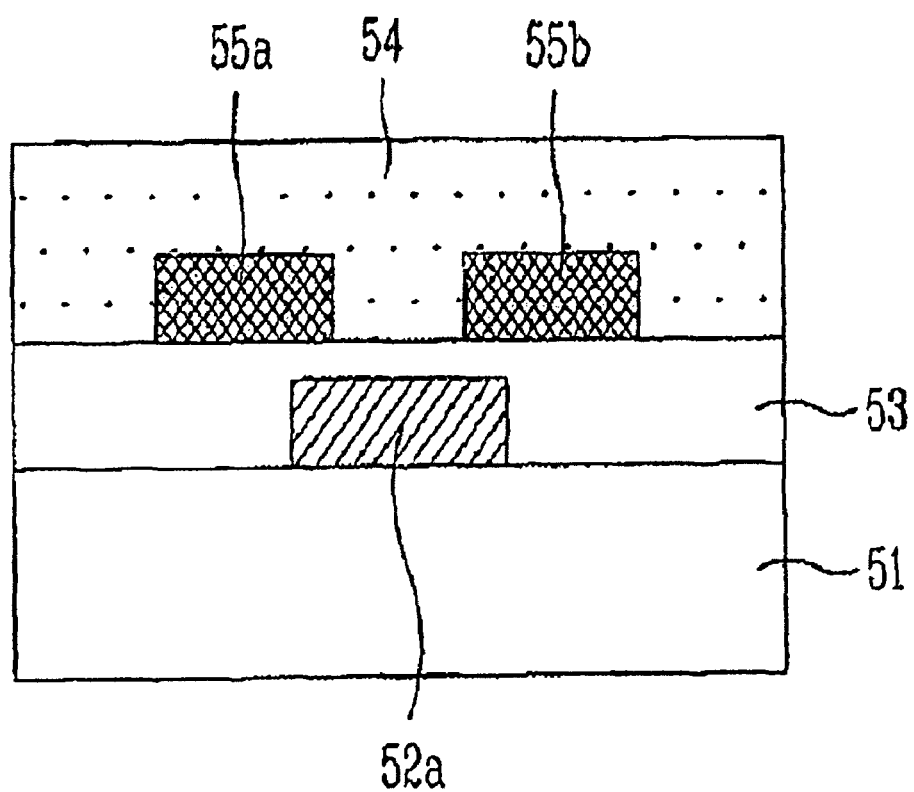
FIG. 1 is a cross-sectional view of illustrating the related art organic thin film transistor.
Figure 2A:
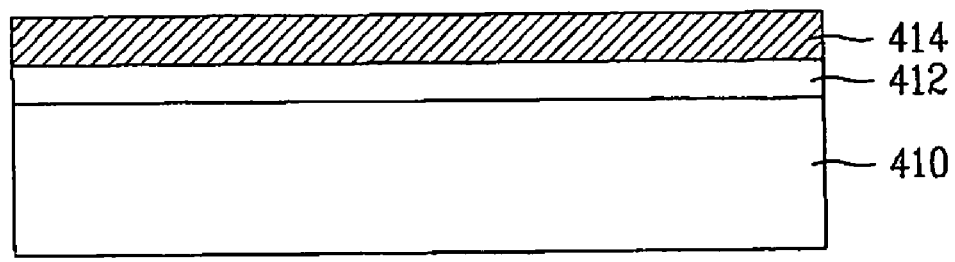
FIGS. 2A to 2D are cross-sectional views illustrating a method for manufacturing an organic thin film transistor according to an embodiment of the invention.
Figure 2B:
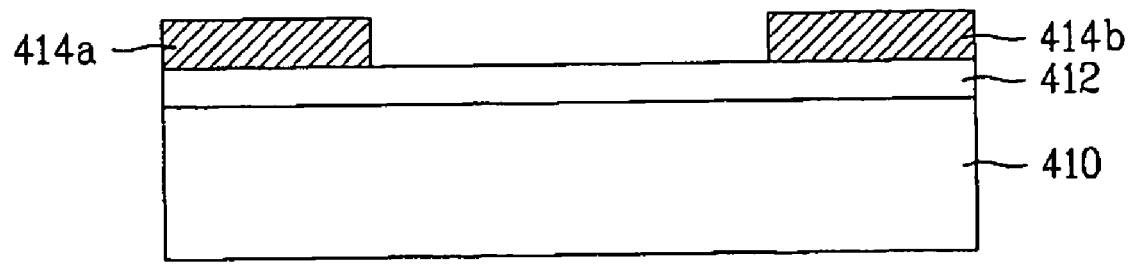
Figure 2C:
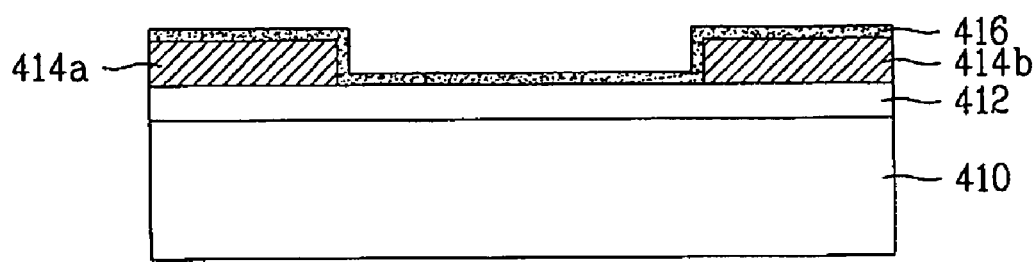
Figure 2D:
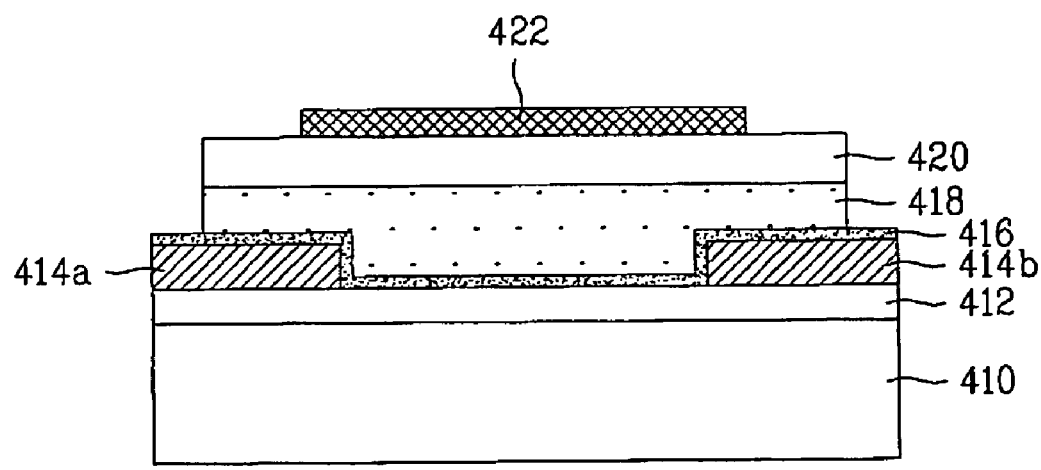
Figure 3:
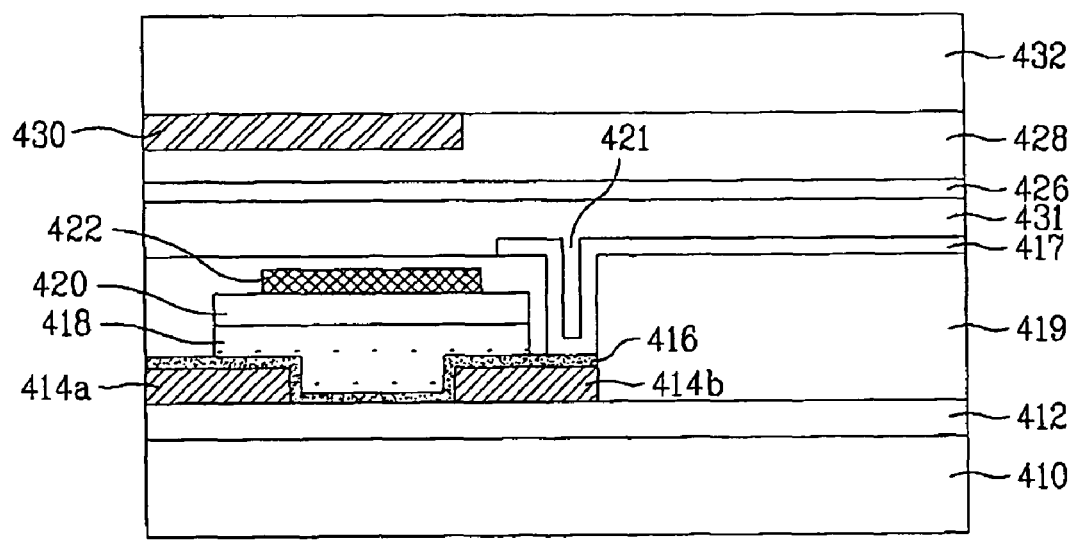
FIG. 3 is a cross-sectional view of an organic thin film transistor according to an embodiment of the invention.

FIGS. 2A to 2D are cross-sectional views illustrating a method for manufacturing an organic thin film transistor according to an embodiment of the invention. FIG. 3 is a cross-sectional view illustrating an organic thin film transistor according to an embodiment of the invention. As shown in FIG. 2D, the organic thin film transistor according to an embodiment of the invention includes a buffer layer 412 formed of an organic material is provided on a lower substrate 410, island-shaped source/drain electrodes 414a/414b formed of a transparent conductive layer, such as ITO or IZO, are provided on the buffer layer 412, a tunneling barrier layer 416 is formed on the buffer layer 412 and the source/drain electrodes 414a/414b, an organic semiconductor layer 418 is formed on the tunneling barrier layer 416, a gate insulation layer 420 is formed on the organic semiconductor layer 418, and a gate electrode 422 is formed on the gate insulating layer 420 and overlapping the source/drain electrodes 414a/414b. The organic semiconductor layer 418 can be formed of one of liquid crystalline polyfluorene block copolymer (LCPBC), pentacene, and polythiophene.

The tunneling barrier layer 416 reduces a voltage drop between the organic semiconductor layer 418 and the source/drain electrodes 414a/414b so that holes can be injected into the source/drain electrodes 414a/414b with ease. The tunneling barrier layer 416 lowers a work function difference between the source/drain electrodes 414a/414b and the source/drain electrodes 414a/414b to thereby lower an energy barrier that prevents charge injection, such as hole injection. Due to the tunneling barrier layer 416, a contact resistance between the organic semiconductor layer 418 and the source/drain electrodes 414a/414b is lowered.

The contact resistance depends on a thickness of the tunneling barrier layer 416. If the tunneling barrier layer 416 is formed at a thickness of 10 Å to 110 Å, the contact resistance is decreased between the organic semiconductor layer 418 and the source/drain electrodes 414a/414b. If the tunneling barrier layer 416 has a thickness above 100 Å, the contact resistance is increased between the organic semiconductor layer 418 and the source/drain electrodes 414a/414b. The tunneling barrier layer 416 may be formed of any one of CBP(4,48-N,N 8-dicarbazole-biphenyl), BCP(2,9-dimethyl-4,7-diphenyl-1,10-phenanthroline), SiNx, or SiO2.

A method for manufacturing the organic thin film transistor according to an embodiment of the invention will be explained as follows. First, as shown in FIG. 2A, the buffer layer 412 is formed on the lower substrate 410, wherein the lower substrate 410 is formed of glass or transparent plastic. The buffer layer 412 is deposited to improve the subsequent crystallization of the organic semiconductor layer. The buffer layer 412 can be formed of an inorganic insulation material, such as silicon oxide layer (SiOx), a silicon nitride layer (SiNx), or a deposition layer of silicon oxide (SiOx) and silicon nitride (SiNx). In the alternative, the buffer layer 412 may be formed of an organic insulation material, such as benzocyclobutene (BCB), acrylic-based material, polyimide, or polymethylmetacrylate (PMMA).

Then, a transparent conductive layer 414 is formed on the buffer layer 412. The transparent conductive layer 414 may be formed of indium tin oxide (ITO) or indium zinc oxide (IZO), which is generally used for fabricating an LCD device. In the alternative, a metal layer of chrome (Cr) or molybdenum (Mo) is formed on the buffer layer 412 and then the transparent conductive layer 414 can be formed on the metal layer. Thus, each of the source/drain electrodes may be formed of a dual-layered structure of the transparent conductive layer and the metal layer, so that it is possible to decrease a line resistance for the source/drain electrodes of the organic thin film transistor.

As shown in FIG. 2B, after coating the transparent conductive layer 414 with photoresist (not shown), a photo mask having a predetermined pattern is positioned above the photoresist, and light is irradiated onto the photoresist and then the photoresist is developed, thereby patterning the photoresist. Then, the transparent conductive layer 414 is selectively etched by using the patterned photoresist as a mask, thereby forming the source/drain electrodes 414a/414b. If a metal layer was first deposited on the buffer layer 412, the metal layer is also patterned while the transparent conductive layer 414 is patterned. Then, the photoresist is removed.

As shown in FIG. 2C, the tunneling barrier layer 416 is formed on the buffer layer 412 and the source/drain electrodes 414a/414b. The tunneling barrier layer 416 is deposited at a thickness of 10 Å to 110 Å. The tunneling barrier layer 416 may be formed of one of CBP (4,48-N,N 8-dicarbazole-biphenyl), BCP(2,9-dimethyl-4,7-diphenyl-1,10-phenanthroline), SiNx, and SiO$_2$. The tunneling barrier layer 416 is formed on the barrier layer 412 as well as upper surfaces and sidewalls of the source/drain electrodes 414a/414b. Thus, the tunneling barrier layer 416 is formed on the source/drain electrodes 414a/414b and extends between the source/drain electrodes 414a/414b.

As shown in FIG. 2D, an organic material is formed on a surface of the lower substrate including the tunneling barrier layer 416, and is then patterned, thereby forming the organic semiconductor layer 418. The organic semiconductor layer 418 may be formed of one of liquid crystalline polyfluorene block copolymer (LCPBC), pentacene and polythiophene. Thereafter, an inorganic insulation material or an organic insulating material is formed on the organic semiconductor layer 418 to form the gate insulation layer 420. The gate insulation layer 420 may be formed of the inorganic insulation material of silicon oxide (SiOx) or silicon nitride (SiNx), or may be formed of the organic insulation material, such as BCB, acrylic-based material, or polyimide. To obtain desirable adhesive strength between the gate insulation layer 420 and the organic semiconductor layer, the gate insulation layer 420 should be formed of an organic insulation material.

Then, a metal material is deposited on the gate insulation layer 420. The metal material is then patterned by photolithography, thereby forming the gate electrode 422 overlapping the source/drain electrodes 414a/414b. The gate electrode 422 may be formed of a metal material of chrome (Cr), copper (Cu), molybdenum (Mo), aluminum (Al), aluminum neodymium (AlNd), or tungsten (W), or may be formed of an alloy thereof.

If the gate electrode 422, the gate insulation layer 420, the source/drain electrodes 414a/414b and the organic semiconductor layer 418 are formed of the organic material, they can be manufactured in a low-temperature process. The lower substrate 410 may be formed of a flexible plastic substrate or film in a low-temperature process.

As shown in FIG. 3, an LCD device provided with the organic thin film transistor according to an embodiment of the invention includes a passivation layer 419 and a pixel electrode 417. In this case, the passivation layer 419 is formed over the lower substrate 410 and the organic thin film transistor, wherein the passivation layer is formed of the organic insulation material, such as BCB, acrylic-based material, and polyimide. Also, the pixel electrode 417 is connected with the drain electrode 414*b* through a contact hole 421. The pixel electrode 417 is formed in a pixel region of the passivation layer 419, wherein the pixel electrode 417 is formed of ITO or IZO.

In addition, an upper substrate is provided opposite to the lower substrate 410, and is bonded to the lower substrate 410. The upper substrate includes a black matrix 430 to prevent light from leaking from portions other than the pixel region, a color filter layer 428 to represent colors, and a common electrode 426 to drive the pixel. The lower and upper substrates are bonded to each other with a predetermined gap therebetween, and a liquid crystal layer 431 is formed in the predetermined gap between the lower and upper substrates.

As mentioned above, the organic thin film transistor according to embodiments of the invention and the method for manufacturing the same have at least the following advantages. In the organic thin film transistor according to embodiments of the invention, a tunneling barrier layer is formed between and contacting the organic semiconductor layer and the source/drain electrodes. The tunneling barrier layer lowers the energy barrier which prevents charge injection, such as hole injection. As a result, the contact resistance decreases between the organic semiconductor layer and the source/drain electrodes, thereby improving the mobility properties of the thin film transistor and preventing the current crowding at low voltages.

It will be apparent to those skilled in the art that various modifications and variations can be made in the an organic thin film transistor and a method for manufacturing the same of embodiments of the invention without departing from the spirit or scope of the invention. Thus, it is intended that embodiments of the invention cover the modifications and variations of this invention provided they come within the scope of the appended claims and their equivalents.

What is claimed is:

1. An organic thin film transistor comprising:
   a buffer layer on a substrate;
   source and drain electrodes on the buffer layer, wherein each of the source and drain electrodes is formed in an island shape;
   a tunneling barrier layer on the source and drain electrodes;
   an organic semiconductor layer on the tunneling barrier layer;
   a gate insulation layer on the organic semiconductor layer; and
   a gate electrode overlapping both edges of the source and drain electrodes, and formed on the gate insulation layer,
   wherein the tunneling barrier layer under the organic semiconductor layer is formed between the source and drain electrodes and the gate electrode,
   wherein the tunneling barrier layer is formed between the source electrode and the organic semiconductor layer, between the drain electrode and the organic semiconductor layer and between the buffer layer and the organic semiconductor layer, and
   wherein the tunneling barrier layer is formed of one of CBP(4,4'-N,N'-dicarbazole-biphenyl), BCP(2,9-dimethyl-4,7-diphenyl-1,10-phenanthroline) and SiNx.

2. The organic thin film transistor of claim 1, wherein the tunneling barrier layer is formed on the buffer layer.

3. The organic thin film transistor of claim 2, wherein the tunneling barrier layer is formed on upper surfaces of the source and drain electrodes, and on sidewalls of the source and drain electrodes.

4. The organic thin film transistor of claim 1, wherein the source and drain electrodes are formed of ITO or IZO.

5. The organic thin film transistor of claim 1, wherein each of the source and drain electrodes is formed in a dual-layered structure having one of IZO and ITO and one of chrome (Cr) and molybdenum (Mo).

6. The organic thin film transistor of claim 1, wherein the organic semiconductor layer is formed of one of liquid crystalline polyfluorene block copolymer (LCPBC), pentacene and polythiophene.

7. An organic thin film transistor comprising:
   source and drain electrodes over a substrate, each of the source and drain electrodes having an island shape;
   a tunneling barrier layer on the source and drain electrodes, and extending between the source and drain electrodes;
   an organic semiconductor layer on the tunneling barrier layer;
   a gate insulation layer on the organic semiconductor layer; and
   a gate electrode overlapping both edges of the source and drain electrodes, and on the gate insulation layer,
   wherein the tunneling barrier layer under the organic semiconductor layer is formed between the source and drain electrodes and the gate electrode,
   wherein the tunneling barrier layer is formed between the source electrode and the organic semiconductor layer, between the drain electrode and the organic semiconductor layer and between the buffer layer and the organic semiconductor layer, and
   wherein the tunneling barrier layer is formed of one of CBP(4,4'-N,N'-dicarbazole-biphenyl), BCP(2,9-dimethyl-4,7-diphenyl-1,10-phenanthroline) and SiNx.

8. The organic thin film transistor of claim 7, further comprising a buffer layer on the substrate.

9. The organic thin film transistor of claim 8, wherein the tunneling barrier layer is formed on the buffer layer.

10. The organic thin film transistor of claim 7, wherein the tunneling barrier layer is formed on upper surfaces of the source and drain electrodes, and on sidewalls of the source and drain electrodes.

11. The organic thin film transistor of claim 7, wherein the source and drain electrodes are formed of ITO or IZO.

12. The organic thin film transistor of claim 7, wherein each of the source and drain electrodes is formed in a dual-layered structure having one of IZO and ITO and one of chrome (Cr) and molybdenum (Mo).

13. The organic thin film transistor of claim 7, wherein the organic semiconductor layer is formed of one of liquid crystalline polyfluorene block copolymer (LCPBC), pentacene and polythiophene.

* * * * *